(12) United States Patent
Lin et al.

(10) Patent No.: US 11,217,661 B2
(45) Date of Patent: Jan. 4, 2022

(54) FERROELECTRIC MEMORIES

(71) Applicant: Industrial Technology Research Institute, Hsinchu (TW)

(72) Inventors: Yu-De Lin, Taoyuan (TW); Heng-Yuan Lee, Hsinchu County (TW); Po-Chun Yeh, Taichung (TW); Chih-Yao Wang, Taichung (TW); Hsin-Yun Yang, Taichung (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 0 days.

(21) Appl. No.: 16/842,589

(22) Filed: Apr. 7, 2020

(65) Prior Publication Data

US 2021/0242304 A1 Aug. 5, 2021

(30) Foreign Application Priority Data

Feb. 3, 2020 (TW) ................................. 109103150

(51) Int. Cl.
*H01L 49/02* (2006.01)
*H01L 27/11502* (2017.01)
(Continued)

(52) U.S. Cl.
CPC ........ *H01L 28/90* (2013.01); *H01L 27/11502* (2013.01); *H01L 28/75* (2013.01);
(Continued)

(58) Field of Classification Search
CPC ......... H01L 28/90; H01L 28/75; H01L 28/56; H01L 27/11507; H01L 27/11502; G11C 11/22
See application file for complete search history.

(56) References Cited

U.S. PATENT DOCUMENTS 6,168,991 B1 * 1/2001 Choi ................. H01L 21/76895
257/306
6,346,741 B1 * 2/2002 Van Buskirk ........... H01L 28/55
257/664
(Continued)

FOREIGN PATENT DOCUMENTS

CN 1319256 A 10/2001
TW 436931 B 5/2001

OTHER PUBLICATIONS

Fengler, Franz P. G., et al. "Comparison of hafnia and PZT based ferroelectrics for future non-volatile FRAM applications," IEEE 6th European Solid State Device Research Conference, 2016, pp. 369-372, IEEE, US.

(Continued)

*Primary Examiner* — Ahmed N Sefer

(57) ABSTRACT

A ferroelectric memory is provided. The ferroelectric memory includes a substrate, a first conductive layer disposed on the substrate, a patterned oxide layer disposed on the first conductive layer and the substrate, exposing a part of the first conductive layer, a second conductive layer disposed on the exposed first conductive layer and the patterned oxide layer, an antiferroelectric layer disposed on the exposed first conductive layer and the second conductive layer, a ferroelectric layer disposed on the second conductive layer and located on the antiferroelectric layer, a conductive oxide layer disposed between the antiferroelectric layer, and a third conductive layer disposed on the conductive oxide layer and between the ferroelectric layer.

20 Claims, 9 Drawing Sheets

(51) Int. Cl.
*H01L 27/11507* (2017.01)
*G11C 11/22* (2006.01)

(52) U.S. Cl.
CPC ............. *G11C 11/22* (2013.01); *G11C 11/221* (2013.01); *H01L 27/11507* (2013.01); *H01L 28/56* (2013.01)

(56) References Cited

U.S. PATENT DOCUMENTS

| | | | |
|---|---|---|---|
| 9,779,797 B2 | 10/2017 | Ino et al. | |
| 9,818,468 B2 | 11/2017 | Muller | |
| 10,403,631 B1* | 9/2019 | Lu .................... | H01L 27/11514 |
| 11,017,830 B1* | 5/2021 | Lin .................... | H01L 27/11502 |
| 2002/0153550 A1* | 10/2002 | An ..................... | H01L 28/57 257/301 |
| 2003/0047771 A1* | 3/2003 | Kweon ............... | H01L 28/60 257/306 |
| 2005/0167725 A1* | 8/2005 | Nagano .............. | H01L 28/57 257/309 |
| 2006/0027847 A1* | 2/2006 | Koo ................... | H01L 27/11502 257/295 |
| 2013/0075862 A1* | 3/2013 | Rennie ............... | H01L 28/90 257/532 |
| 2014/0355328 A1 | 12/2014 | Muller et al. | |
| 2015/0214322 A1 | 7/2015 | Muller et al. | |
| 2016/0276014 A1 | 9/2016 | Fox et al. | |
| 2017/0098599 A1* | 4/2017 | Zhou .................. | H01L 23/5223 |
| 2017/0162250 A1 | 6/2017 | Slesazeck et al. | |
| 2017/0256552 A1 | 9/2017 | Schroder et al. | |
| 2018/0233573 A1 | 8/2018 | Lin et al. | |
| 2018/0374929 A1 | 12/2018 | Yoo | |
| 2019/0074295 A1 | 3/2019 | Schroder | |
| 2019/0115444 A1* | 4/2019 | Bentley ............... | H01L 29/516 |
| 2019/0348539 A1* | 11/2019 | Yoo .................... | H01L 29/6684 |
| 2021/0005728 A1* | 1/2021 | Cheng ................ | H01L 29/7851 |

OTHER PUBLICATIONS

Park, Min Hyuk, et al. "Evolution of phases and ferroelectric properties of thin Hf0.5Zr0.5O2 films according to the thickness and annealing temperature," Applied Physics Letters, 2013, 6 pages, AIP Publishing LLC, US.

A-Paz de Araujo, et al, "Fatigue-free ferroelectric capacitors with platinum electrodes," Letters to Nature, Apr. 13, 1995, pp. 627-629, Nature, US.

Ciuchi, I. V., et al. "Field-induced antiferroelectric to ferroelectric transitions in(Pb1-xLax)(Zr0.90Ti0.10)1-x/4O3 investigated by in situ X-ray diffraction," Journal of the European Ceramic Society, 2017. pp. 4631-4636, Elsevier, US.

Yoo, D. C., et al. "Highly Reliable 50nm-thick PZT Capacitor and Low Voltage FRAM Device using Ir/SrRuO3/MOCVD PZT Capacitor Technology," Symposium on VLSI Technology Digest of Technical Papers, 2005, 2 pages, US.

Böscke, T. S., et al. "Phase transitions in ferroelectric silicon doped hafnium oxide," Applied Physics Letters, 2011, 4 pages, Rightslink, US.

Lowther, J. E., et al. "Relative stability of ZrO2 and HfO2 structural phases" Physical Review B, Dec. 1, 1999, 4 pages, vol. 60, No. 21, The American Physical Society, US.

Taiwan Patent Office, Office Action, Patent Application Serial No. 109103150, dated Nov. 27, 2020, Taiwan.

* cited by examiner

FERROELECTRIC MEMORIES

CROSS REFERENCE TO RELATED APPLICATIONS

This Application claims priority of Taiwan Patent Application No. 109103150, filed on Feb. 3, 2020, the entirety of which is incorporated by reference herein.

TECHNICAL FIELD

The disclosure relates to a ferroelectric memory, and relates to a ferroelectric memory with a parallel architecture of a ferroelectric capacitor and an antiferroelectric capacitor.

BACKGROUND

Ferroelectric memories are destructive read memories and require a high number of operations. Therefore, it's valuable to know how to increase the number of operations. Conventional ferroelectric memory technology is based on hafnium oxide (HfO) materials; its operational degradation is mostly generated after $10^6$ cycles, which does not meet the needs of industry.

SUMMARY

In accordance with one embodiment of the disclosure, a ferroelectric memory is provided. The ferroelectric memory includes a substrate; a first conductive layer disposed on the substrate; a patterned oxide layer disposed on the first conductive layer and the substrate, exposing a part of the first conductive layer; a second conductive layer disposed on the exposed first conductive layer and the patterned oxide layer; an antiferroelectric layer disposed on the exposed first conductive layer and the second conductive layer; a ferroelectric layer disposed on the second conductive layer and located on the antiferroelectric layer; a conductive oxide layer disposed between the antiferroelectric layer; and a third conductive layer disposed on the conductive oxide layer and between the ferroelectric layer.

In one embodiment, the patterned oxide layer includes a first portion and a second portion located on the first portion. The stress of the second portion is greater than that of the first portion. The first portion corresponds to the antiferroelectric layer. The second portion corresponds to the ferroelectric layer.

In accordance with one embodiment of the disclosure, a ferroelectric memory is provided. The ferroelectric memory includes a substrate; a first conductive layer disposed on the substrate; a patterned oxide layer disposed on the first conductive layer and the substrate, exposing a part of the first conductive layer; a second conductive layer disposed on the exposed first conductive layer and the patterned oxide layer; a ferroelectric layer disposed on the exposed first conductive layer and the second conductive layer; an antiferroelectric layer disposed on the second conductive layer and located on the ferroelectric layer; a third conductive layer disposed between the ferroelectric layer; and a conductive oxide layer disposed on the third conductive layer and between the antiferroelectric layer.

In one embodiment, the patterned oxide layer includes a first portion and a second portion located on the first portion. The stress of the first portion is greater than that of the second portion. The first portion corresponds to the ferroelectric layer. The second portion corresponds to the antiferroelectric layer.

In accordance with one embodiment of the disclosure, a method for fabricating a ferroelectric memory is provided. The fabrication method includes providing a substrate; forming a first conductive layer on the substrate; forming a patterned oxide layer on the first conductive layer and the substrate, exposing a part of the first conductive layer; forming a second conductive layer on the exposed first conductive layer and the patterned oxide layer; forming a ferroelectric layer on the exposed first conductive layer and the second conductive layer; forming a conductive oxide layer between the ferroelectric layer; etching a part of the conductive oxide layer; forming a third conductive layer on the conductive oxide layer; and performing an annealing process, so that the ferroelectric layer surrounding the conductive oxide layer forms an antiferroelectric layer.

In one embodiment, the step of forming the patterned oxide layer includes forming a first sub-oxide layer, and then, forming a second sub-oxide layer on the first sub-oxide layer, and then patterning the first sub-oxide layer and the second sub-oxide layer, wherein the stress of the second sub-oxide layer is greater than that of the first sub-oxide layer.

In accordance with one embodiment of the disclosure, a method for fabricating a ferroelectric memory is provided. The fabrication method includes providing a substrate; forming a first conductive layer on the substrate; forming a patterned oxide layer on the first conductive layer and the substrate, exposing a part of the first conductive layer; forming a second conductive layer on the exposed first conductive layer and the patterned oxide layer; forming a ferroelectric layer on the exposed first conductive layer and the second conductive layer; forming a third conductive layer between the ferroelectric layer; etching a part of the third conductive layer; forming a conductive oxide layer on the third conductive layer; and performing an annealing process, so that the ferroelectric layer surrounding the conductive oxide layer forms an antiferroelectric layer.

In one embodiment, the step of forming the patterned oxide layer includes forming a first sub-oxide layer, and then, forming a second sub-oxide layer on the first sub-oxide layer, and then patterning the first sub-oxide layer and the second sub-oxide layer, wherein the stress of the first sub-oxide layer is greater than that of the second sub-oxide layer.

A detailed description is given in the following embodiments with reference to the accompanying drawings.

BRIEF DESCRIPTION OF THE DRAWINGS

The disclosure can be more fully understood by reading the subsequent detailed description and examples with references made to the accompanying drawings, wherein.

DETAILED DESCRIPTION

The following description is of the best-contemplated mode of carrying out the disclosure. This description is made for the purpose of illustrating the general principles of the disclosure and should not be taken in a limiting sense. The scope of the disclosure is determined by reference to the appended claims.

In order to increase the number of operations of ferroelectric memories, the disclosure provides a ferroelectric memory. Using an environmental stress design in structures, a three-dimensional parallel architecture of an antiferroelectric (AFE) capacitor with a ferroelectric-delayed wake-up behavior combined with a ferroelectric (FE) capacitor is formed.

Figure 1:
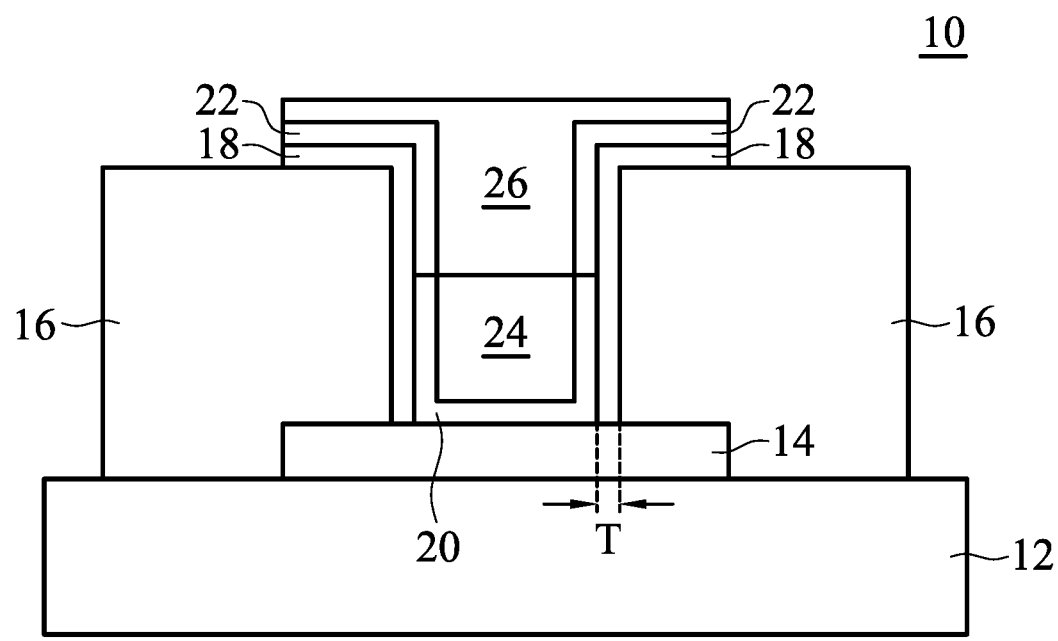
FIG. 1 is a cross-sectional view of a ferroelectric memory in accordance with one embodiment of the disclosure.

Referring to FIG. 1, in accordance with one embodiment of the disclosure, a ferroelectric memory 10 is provided. FIG. 1 is a cross-sectional view of the ferroelectric memory 10.

The ferroelectric memory (i.e. Ferroelectric RAM; FeRAM) 10 includes a substrate 12, a first conductive layer 14, a patterned oxide layer 16, a second conductive layer 18, an antiferroelectric layer 20, a ferroelectric layer 22, a conductive oxide layer 24 and a third conductive layer 26. The first conductive layer 14 is disposed on the substrate 12. The patterned oxide layer 16 is disposed on the first conductive layer 14 and the substrate 12, and a part of the first conductive layer 14 is exposed. The second conductive layer 18 is disposed on the exposed first conductive layer 14 and the patterned oxide layer 16. In this embodiment, the antiferroelectric layer 20 is disposed on the exposed first conductive layer 14 and the second conductive layer 18. The ferroelectric layer 22 is disposed on the second conductive layer 18 and located on the antiferroelectric layer 20. The conductive oxide layer 24 is disposed between the antiferroelectric layer 20. The third conductive layer 26 is disposed on the conductive oxide layer 24 and between the ferroelectric layer 22.

In one embodiment, the patterned oxide layer 16 may include the following materials, for example, silicon oxide, silicon nitride or silicon oxynitride, but is not limited thereto.

In one embodiment, the first conductive layer 14, the second conductive layer 18 and the third conductive layer 26 may include, for example, semiconductor, conductive dielectric or metal. In one embodiment, the first conductive layer 14, the second conductive layer 18 and the third conductive layer 26 may include the following materials, for example, zirconium (Zr), hafnium (Hf), titanium nitride (TiN), titanium (Ti), tantalum (Ta), tantalum nitride (TaN), tantalum silicide (TaSi), tantalum carbonitride (TaCN), titanium aluminum nitride (TiAlN), zinc (Zn), nickel (Ni), nickel silicide (NiSi), ruthenium (Ru), carbon (C), silicon (Si), silicon nitride (SiNx), germanium (Ge), platinum (Pt), aluminum (Al), aluminum nitride (AlN), yttrium (Y), gadolinium (Gd), strontium (Sr), tungsten (W), tungsten silicide (WSi), tungsten nitride (WN), gallium (Ga) or gallium nitride (GaN), but are not limited thereto.

In one embodiment, the thickness "T" of the second conductive layer 18 is in a range from about 100 Å to about 500 Å.

In one embodiment, the antiferroelectric layer 20 and the ferroelectric layer 22 may include the following materials, for example, hafnium zirconium oxide ($HfZrO_x$), hafnium silicon oxide ($HfSiO_x$), hafnium oxide ($HfO_x$), hafnium yttrium oxide ($HfYO_x$), hafnium gadolinium oxide ($HfGdO_x$), hafnium strontium oxide ($HfSrO_x$), strontium titanium oxide ($SrTiO_x$), strontium calcium titanate ($SrCaTiO_3$), $Ag(Nb_{1-x}Ta_x)O_3$, barium strontium titanate ($BaSrTiO_3$), barium titanate ($BaTiO_3$), zirconium oxide ($ZrO_x$) or hafnium aluminum oxide ($HfAlO_x$), but are not limited thereto.

In one embodiment, the conductive oxide layer 24 may include the following materials, for example, zinc oxide (ZnO), titanium oxide (TiOx), titanium oxynitride (TiON), tantalum oxynitride (TaON), silicon oxide (SiOx), silicon oxynitride (SiONx), ruthenium oxide (RuO), strontium ruthenium oxide (SrRuO), strontium hafnium oxide ($SrHfO_3$), germanium oxide (GeO), tantalum oxide (TaO) or tantalum pentoxide ($Ta_2O_5$), but is not limited thereto.

Figure 2:
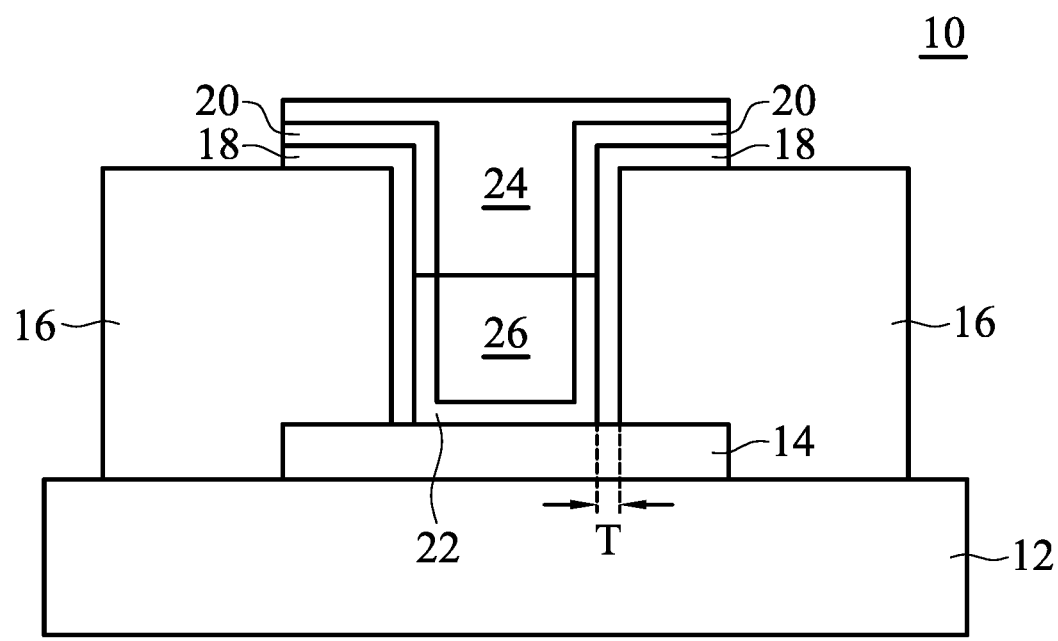
FIG. 2 is a cross-sectional view of a ferroelectric memory in accordance with one embodiment of the disclosure.

Referring to FIG. 2, in accordance with one embodiment of the disclosure, a ferroelectric memory 10 is provided. FIG. 2 is a cross-sectional view of the ferroelectric memory 10.

The ferroelectric memory (i.e. Ferroelectric RAM; FeRAM) 10 includes a substrate 12, a first conductive layer 14, a patterned oxide layer 16, a second conductive layer 18, an antiferroelectric layer 20, a ferroelectric layer 22, a conductive oxide layer 24 and a third conductive layer 26. The first conductive layer 14 is disposed on the substrate 12. The patterned oxide layer 16 is disposed on the first conductive layer 14 and the substrate 12, and a part of the first conductive layer 14 is exposed. The second conductive layer 18 is disposed on the exposed first conductive layer 14 and the patterned oxide layer 16. In this embodiment, the ferroelectric layer 22 is disposed on the exposed first conductive layer 14 and the second conductive layer 18. The antiferroelectric layer 20 is disposed on the second conductive layer 18 and located on the ferroelectric layer 22. The third conductive layer 26 is disposed between the ferroelectric layer 22. The conductive oxide layer 24 is disposed on the third conductive layer 26 and between the antiferroelectric layer 20.

In one embodiment, the patterned oxide layer 16 may include the following materials, for example, silicon oxide, silicon nitride or silicon oxynitride, but is not limited thereto.

In one embodiment, the first conductive layer 14, the second conductive layer 18 and the third conductive layer 26 may include, for example, semiconductor, conductive dielectric or metal. In one embodiment, the first conductive layer 14, the second conductive layer 18 and the third conductive layer 26 may include the following materials, for example, zirconium (Zr), hafnium (Hf), titanium nitride (TiN), titanium (Ti), tantalum (Ta), tantalum nitride (TaN), tantalum silicide (TaSi), tantalum carbonitride (TaCN), titanium aluminum nitride (TiAlN), zinc (Zn), nickel (Ni), nickel silicide (NiSi), ruthenium (Ru), carbon (C), silicon (Si), silicon nitride (SiNx), germanium (Ge), platinum (Pt), aluminum (Al), aluminum nitride (AlN), yttrium (Y), gadolinium (Gd), strontium (Sr), tungsten (W), tungsten silicide (WSi), tungsten nitride (WN), gallium (Ga) or gallium nitride (GaN), but are not limited thereto.

In one embodiment, the thickness "T" of the second conductive layer 18 is in a range from about 100 Å to about 500 Å.

In one embodiment, the antiferroelectric layer 20 and the ferroelectric layer 22 may include the following materials, for example, hafnium zirconium oxide ($HfZrO_x$), hafnium silicon oxide ($HfSiO_x$), hafnium oxide ($HfO_x$), hafnium yttrium oxide ($HfYO_x$), hafnium gadolinium oxide ($HfGdO_x$), hafnium strontium oxide ($HfSrO_x$), strontium titanium oxide ($SrTiO_x$), strontium calcium titanate ($SrCaTiO_3$), $Ag(Nb_{1-x}Ta_x)O_3$, barium strontium titanate ($BaSrTiO_3$), barium titanate ($BaTiO_3$), zirconium oxide ($ZrO_x$) or hafnium aluminum oxide ($HfAlO_x$), but are not limited thereto.

In one embodiment, the conductive oxide layer 24 may include the following materials, for example, zinc oxide (ZnO), titanium oxide (TiOx), titanium oxynitride (TiON), tantalum oxynitride (TaON), silicon oxide (SiOx), silicon oxynitride (SiONx), ruthenium oxide (RuO), strontium ruthenium oxide (SrRuO), strontium hafnium oxide (SrHfO$_3$), germanium oxide (GeO), tantalum oxide (TaO) or tantalum pentoxide (Ta$_2$O$_5$), but is not limited thereto.

Figure 3:
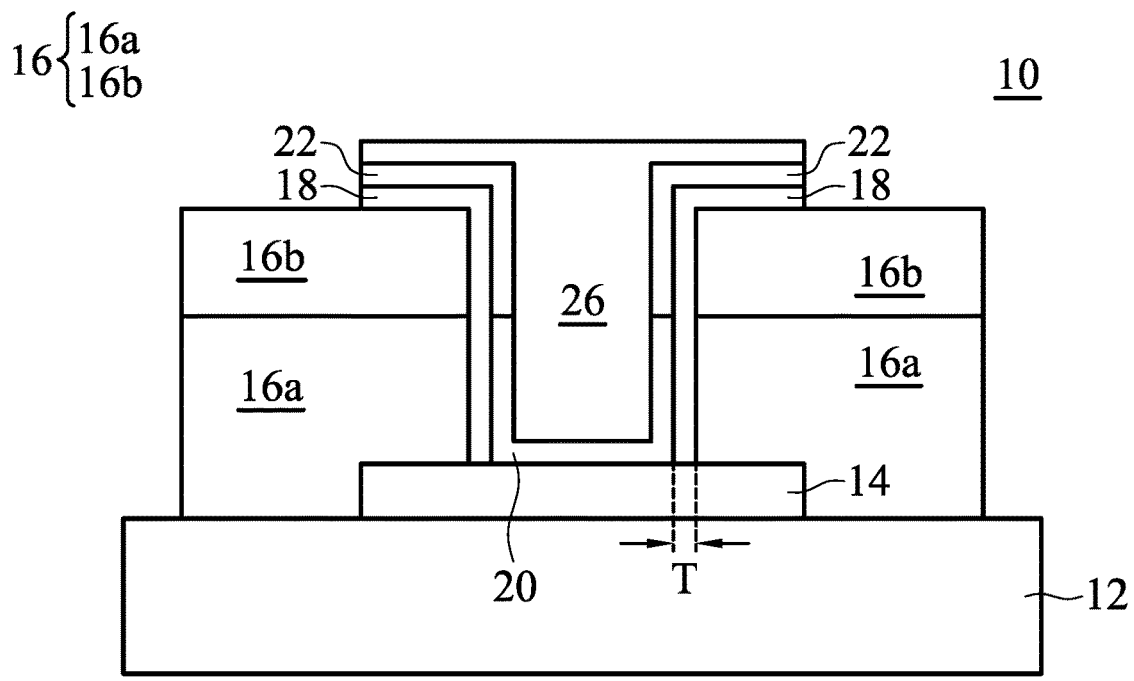
FIG. 3 is a cross-sectional view of a ferroelectric memory in accordance with one embodiment of the disclosure.

Referring to FIG. 3, in accordance with one embodiment of the disclosure, a ferroelectric memory 10 is provided. FIG. 3 is a cross-sectional view of the ferroelectric memory 10.

The ferroelectric memory (i.e. Ferroelectric RAM; FeRAM) 10 includes a substrate 12, a first conductive layer 14, a patterned oxide layer 16, a second conductive layer 18, an antiferroelectric layer 20, a ferroelectric layer 22, and a third conductive layer 26. The first conductive layer 14 is disposed on the substrate 12. The patterned oxide layer 16 is disposed on the first conductive layer 14 and the substrate 12, and a part of the first conductive layer 14 is exposed. The second conductive layer 18 is disposed on the exposed first conductive layer 14 and the patterned oxide layer 16. The antiferroelectric layer 20 is disposed on the exposed first conductive layer 14 and the second conductive layer 18. The ferroelectric layer 22 is disposed on the second conductive layer 18 and located on the antiferroelectric layer 20. In this embodiment, the third conductive layer 26 is disposed between the antiferroelectric layer 20, and between the ferroelectric layer 22.

In this embodiment, the patterned oxide layer 16 includes a first portion 16a and a second portion 16b. The second portion 16b is located on the first portion 16a. The stress of the second portion 16b is greater than that of the first portion 16a. The first portion 16a corresponds to the antiferroelectric layer 20. The second portion 16b corresponds to the ferroelectric layer 22. In one embodiment, the first portion 16a of the patterned oxide layer 16 may include the following materials, for example, silicon oxide, silicon nitride or silicon oxynitride, but is not limited thereto. In one embodiment, the second portion 16b of the patterned oxide layer 16 may include the following materials, for example, silicon oxide, silicon nitride or silicon oxynitride, but is not limited thereto.

In one embodiment, the first conductive layer 14, the second conductive layer 18 and the third conductive layer 26 may include, for example, semiconductor, conductive dielectric or metal. In one embodiment, the first conductive layer 14, the second conductive layer 18 and the third conductive layer 26 may include the following materials, for example, zirconium (Zr), hafnium (Hf), titanium nitride (TiN), titanium (Ti), tantalum (Ta), tantalum nitride (TaN), tantalum silicide (TaSi), tantalum carbonitride (TaCN), titanium aluminum nitride (TiAlN), zinc (Zn), nickel (Ni), nickel silicide (NiSi), ruthenium (Ru), carbon (C), silicon (Si), silicon nitride (SiNx), germanium (Ge), platinum (Pt), aluminum (Al), aluminum nitride (AlN), yttrium (Y), gadolinium (Gd), strontium (Sr), tungsten (W), tungsten silicide (WSi), tungsten nitride (WN), gallium (Ga) or gallium nitride (GaN), but are not limited thereto.

In one embodiment, the thickness "T" of the second conductive layer 18 is in a range from about 100 Å to about 500 Å.

In one embodiment, the antiferroelectric layer 20 and the ferroelectric layer 22 may include the following materials, for example, hafnium zirconium oxide (HfZrO$_x$), hafnium silicon oxide (HfSiO$_x$), hafnium oxide (HfO$_x$), hafnium yttrium oxide (HfYO$_x$), hafnium gadolinium oxide (HfGdO$_x$), hafnium strontium oxide (HfSrO$_x$), strontium titanium oxide (SrTiO$_x$), strontium calcium titanate (SrCaTiO$_3$), Ag(Nb$_{1-x}$Ta$_x$)O$_3$, barium strontium titanate (BaSrTiO$_3$), barium titanate (BaTiO$_3$), zirconium oxide (ZrO$_x$) or hafnium aluminum oxide (HfAlO$_x$), but are not limited thereto.

Figure 4:
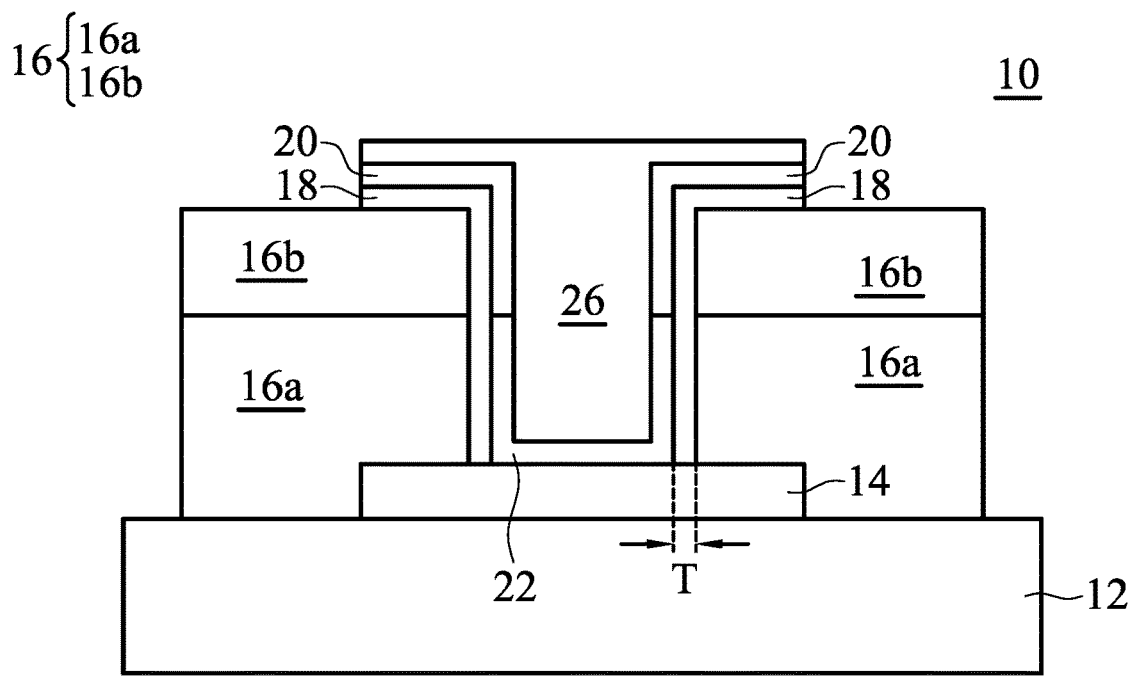
FIG. 4 is a cross-sectional view of a ferroelectric memory in accordance with one embodiment of the disclosure.

Referring to FIG. 4, in accordance with one embodiment of the disclosure, a ferroelectric memory 10 is provided. FIG. 4 is a cross-sectional view of the ferroelectric memory 10.

The ferroelectric memory (i.e. Ferroelectric RAM; FeRAM) 10 includes a substrate 12, a first conductive layer 14, a patterned oxide layer 16, a second conductive layer 18, an antiferroelectric layer 20, a ferroelectric layer 22, and a third conductive layer 26. The first conductive layer 14 is disposed on the substrate 12. The patterned oxide layer 16 is disposed on the first conductive layer 14 and the substrate 12, and a part of the first conductive layer 14 is exposed. The second conductive layer 18 is disposed on the exposed first conductive layer 14 and the patterned oxide layer 16. The ferroelectric layer 22 is disposed on the exposed first conductive layer 14 and the second conductive layer 18. The antiferroelectric layer 20 is disposed on the second conductive layer 18 and located on the ferroelectric layer 22. In this embodiment, the third conductive layer 26 is disposed between the antiferroelectric layer 20, and between the ferroelectric layer 22.

In this embodiment, the patterned oxide layer 16 includes a first portion 16a and a second portion 16b. The second portion 16b is located on the first portion 16a. The stress of the first portion 16a is greater than that of the second portion 16b. The first portion 16a corresponds to the ferroelectric layer 22. The second portion 16b corresponds to the antiferroelectric layer 20. In one embodiment, the first portion 16a of the patterned oxide layer 16 may include the following materials, for example, silicon oxide, silicon nitride or silicon oxynitride, but is not limited thereto. In one embodiment, the second portion 16b of the patterned oxide layer 16 may include the following materials, for example, silicon oxide, silicon nitride or silicon oxynitride, but is not limited thereto.

In one embodiment, the first conductive layer 14, the second conductive layer 18 and the third conductive layer 26 may include, for example, semiconductor, conductive dielectric or metal. In one embodiment, the first conductive layer 14, the second conductive layer 18 and the third conductive layer 26 may include the following materials, for example, zirconium (Zr), hafnium (Hf), titanium nitride (TiN), titanium (Ti), tantalum (Ta), tantalum nitride (TaN), tantalum silicide (TaSi), tantalum carbonitride (TaCN), titanium aluminum nitride (TiAlN), zinc (Zn), nickel (Ni), nickel silicide (NiSi), ruthenium (Ru), carbon (C), silicon (Si), silicon nitride (SiNx), germanium (Ge), platinum (Pt), aluminum (Al), aluminum nitride (AlN), yttrium (Y), gadolinium (Gd), strontium (Sr), tungsten (W), tungsten silicide (WSi), tungsten nitride (WN), gallium (Ga) or gallium nitride (GaN), but are not limited thereto.

In one embodiment, the thickness "T" of the second conductive layer 18 is in a range from about 100 Å to about 500 Å.

In one embodiment, the antiferroelectric layer 20 and the ferroelectric layer 22 may include the following materials, for example, hafnium zirconium oxide (HfZrO$_x$), hafnium silicon oxide (HfSiO$_x$), hafnium oxide (HfO$_x$), hafnium yttrium oxide (HfYO$_x$), hafnium gadolinium oxide (HfGdO$_x$), hafnium strontium oxide (HfSrO$_x$), strontium titanium oxide (SrTiO$_x$), strontium calcium titanate (SrCaTiO$_3$), Ag(Nb$_{1-x}$Ta$_x$)O$_3$, barium strontium titanate (BaSrTiO$_3$), barium titanate (BaTiO$_3$), zirconium oxide (ZrO$_x$) or hafnium aluminum oxide (HfAlO$_x$), but are not limited thereto.

Referring to FIGS. 5A-5G, in accordance with one embodiment of the disclosure, a method for fabricating a ferroelectric memory is provided. FIGS. 5A-5G are cross-sectional views of the method for fabricating a ferroelectric memory.

Figure 5A:
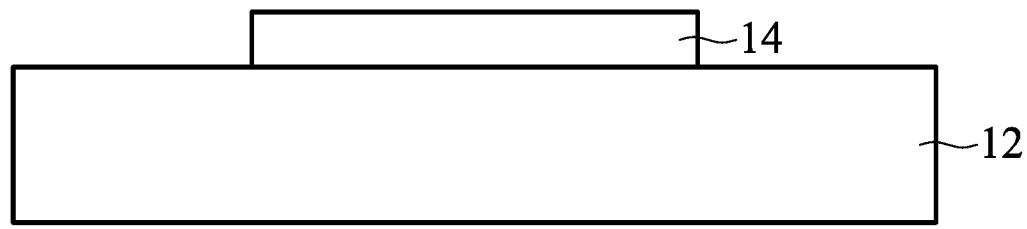
FIGS. 5A-5G are cross-sectional views of a method for fabricating a ferroelectric memory in accordance with one embodiment of the disclosure.

First, as shown in FIG. 5A, a substrate 12 with a first conductive layer 14 formed thereon is provided. In one embodiment, the first conductive layer 14 is deposited by, for example, plasma-enhanced chemical vapor deposition (PECVD), chemical vapor deposition (CVD) or atomic layer deposition (ALD).

Figure 5B:
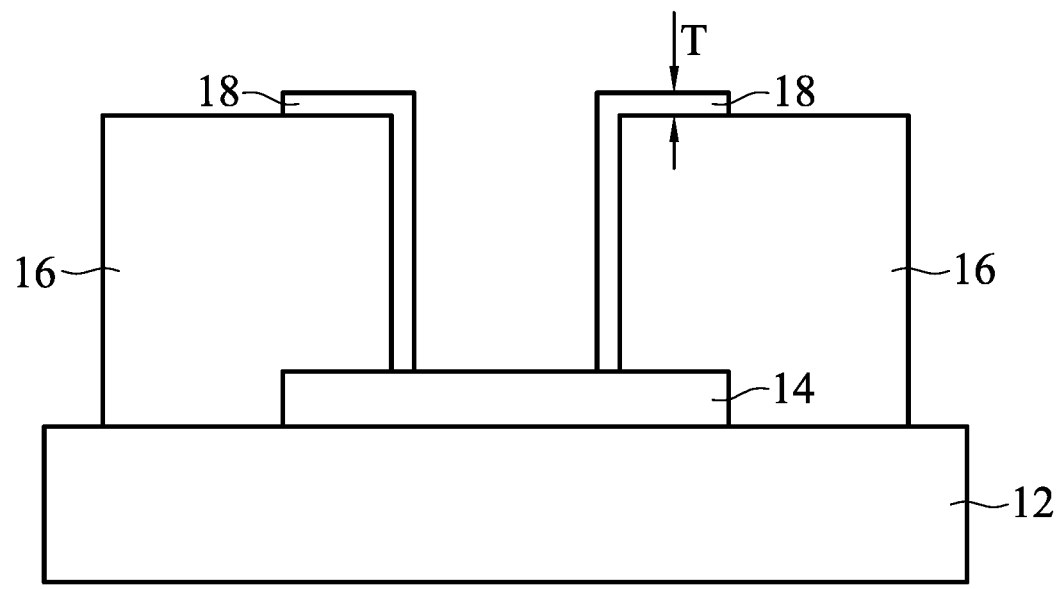

Next, as shown in FIG. 5B, a patterned oxide layer 16 is formed on the first conductive layer 14 and the substrate 12, and a part of the first conductive layer 14 is exposed. Next, a second conductive layer 18 is formed on the exposed first conductive layer 14 and the patterned oxide layer 16. In one embodiment, the thickness "T" of the second conductive layer 18 is in a range from about 100 Å to about 500 Å.

In one embodiment, according to various aspect ratios of the opening of the patterned oxide layer 16, the second conductive layer 18 is deposited on the first conductive layer 14 and the patterned oxide layer 16 using different deposition processes. For example, when the aspect ratio of the opening is less than 3, the second conductive layer 18 is deposited by, for example, plasma-enhanced chemical vapor deposition (PECVD). When the aspect ratio of the opening is between 3 and 10, the second conductive layer 18 is deposited by, for example, chemical vapor deposition (CVD). When the aspect ratio of the opening is greater than 10, the second conductive layer 18 is deposited by, for example, atomic layer deposition (ALD).

Figure 5C:
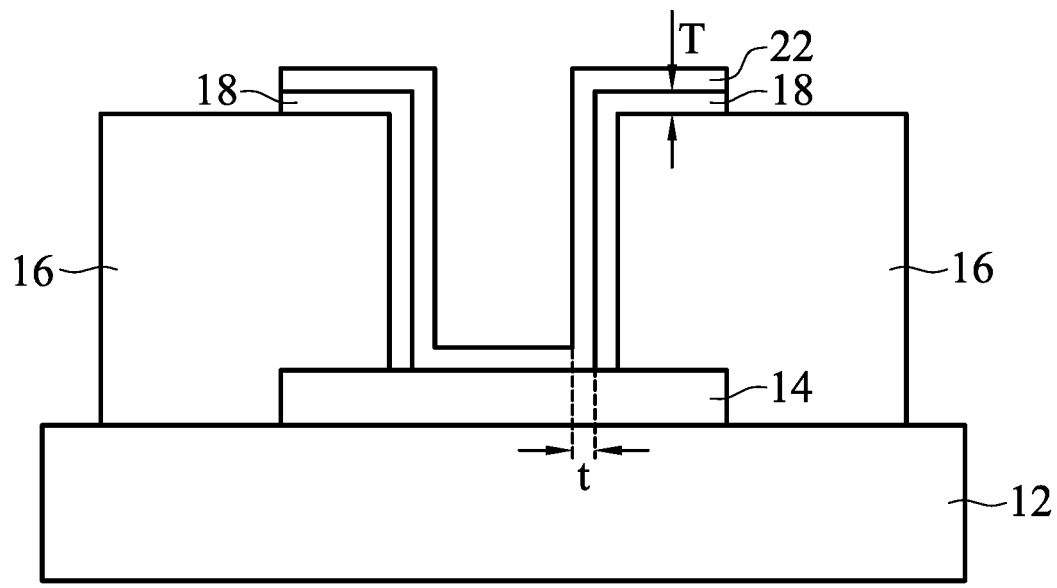

Next, as shown in FIG. 5C, a ferroelectric (FE) layer 22 is formed on the exposed first conductive layer 14 and the second conductive layer 18. In one embodiment, the ferroelectric layer 22 is deposited by, for example, atomic layer deposition (ALD). In one embodiment, the thickness "t" of the ferroelectric layer 22 is in a range from about 20 Å to about 200 Å.

Figure 5D:
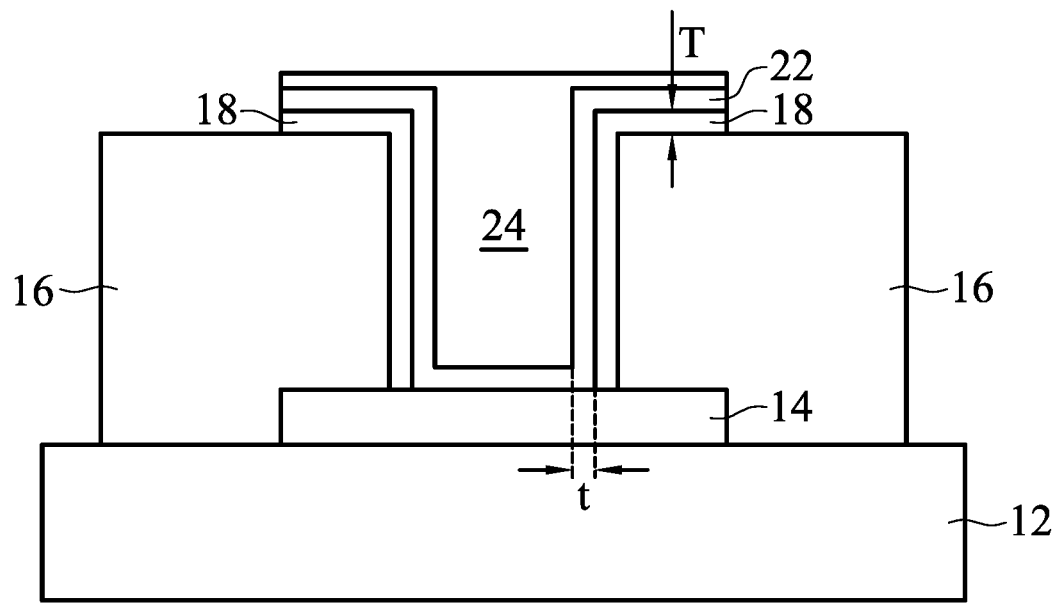

Next, as shown in FIG. 5D, a conductive oxide layer 24 is filled between the ferroelectric layer 22. In one embodiment, the conductive oxide layer 24 is deposited by, for example, chemical vapor deposition (CVD) or atomic layer deposition (ALD).

Figure 5E:
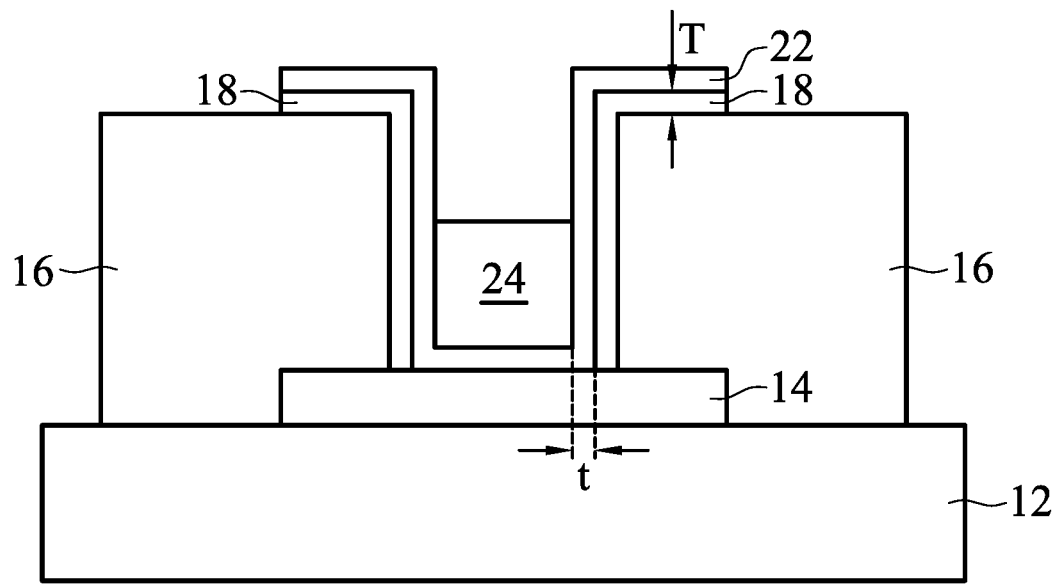

Next, as shown in FIG. 5E, a part of the conductive oxide layer 24 is etched to a specific height, that is, the height of the subsequently formed antiferroelectric layer. In one embodiment, the conductive oxide layer 24 is etched using any appropriate etching processes.

Figure 5F:
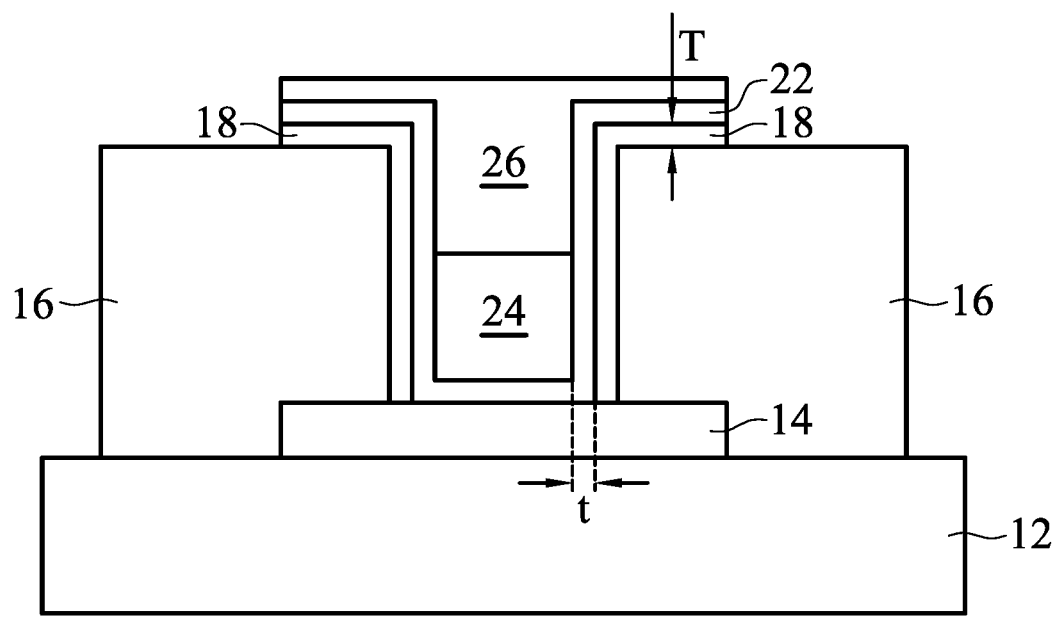

Next, as shown in FIG. 5F, a third conductive layer 26 is filled on the conductive oxide layer 24. In one embodiment, the third conductive layer 26 is deposited by, for example, plasma-enhanced chemical vapor deposition (PECVD), chemical vapor deposition (CVD) or atomic layer deposition (ALD).

Figure 5G:
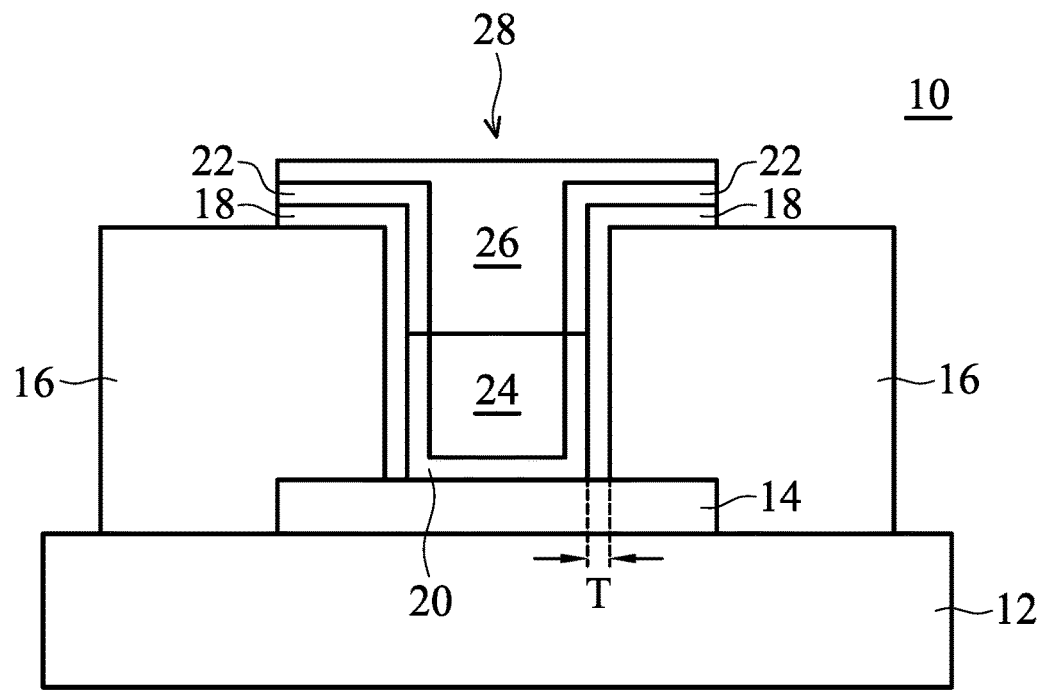

Next, an annealing process 28 is performed. Due to various environmental stresses around the ferroelectric layer 22, the ferroelectric layer 22 located around the conductive oxide layer 24 (which generates a less stress) is transformed into the antiferroelectric layer 20 after the annealing process 28. The ferroelectric layer 22 located around the third conductive layer 26 (which generates a greater stress) is still maintained as a ferroelectric layer, so that a three-dimensional parallel architecture of the ferroelectric layer 22 and the antiferroelectric layer 20 is formed, as shown in FIG. 5G. In one embodiment, the temperature of the annealing process 28 is in a range from about 350° C. to about 600° C. So far, the production of the ferroelectric memory of this embodiment is completed.

Referring to FIGS. 6A-6G, in accordance with one embodiment of the disclosure, a method for fabricating a ferroelectric memory is provided. FIGS. 6A-6G are cross-sectional views of the method for fabricating a ferroelectric memory.

Figure 6A:
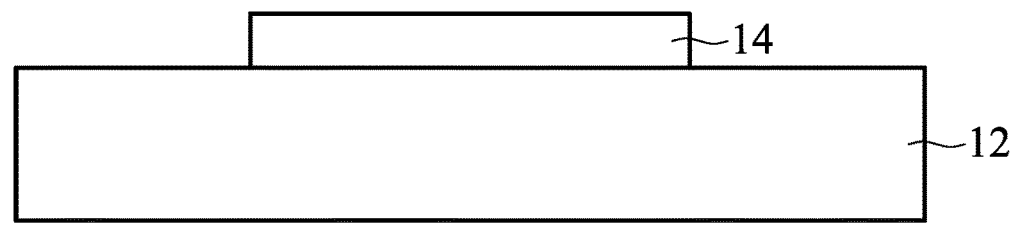
FIGS. 6A-6G are cross-sectional views of a method for fabricating a ferroelectric memory in accordance with one embodiment of the disclosure.

First, as shown in FIG. 6A, a substrate 12 with a first conductive layer 14 formed thereon is provided. In one embodiment, the first conductive layer 14 is deposited by, for example, plasma-enhanced chemical vapor deposition (PECVD), chemical vapor deposition (CVD) or atomic layer deposition (ALD).

Figure 6B:
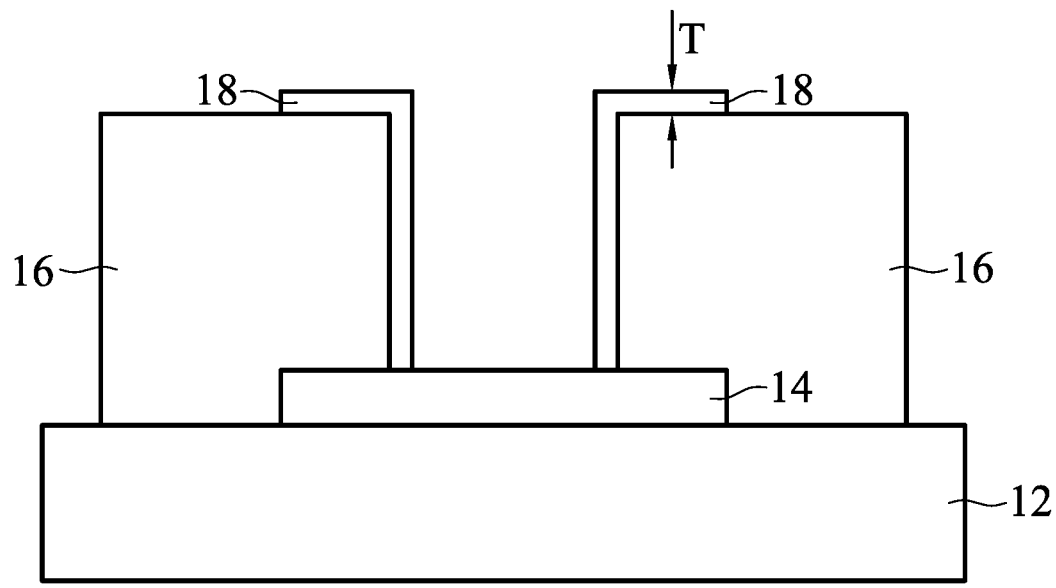

Next, as shown in FIG. 6B, a patterned oxide layer 16 is formed on the first conductive layer 14 and the substrate 12, and a part of the first conductive layer 14 is exposed. Next, a second conductive layer 18 is formed on the exposed first conductive layer 14 and the patterned oxide layer 16. In one embodiment, the thickness "T" of the second conductive layer 18 is in a range from about 100 Å to about 500 Å.

In one embodiment, according to various aspect ratios of the opening of the patterned oxide layer 16, the second conductive layer 18 is deposited on the first conductive layer 14 and the patterned oxide layer 16 using different deposition processes. For example, when the aspect ratio of the opening is less than 3, the second conductive layer 18 is deposited by, for example, plasma-enhanced chemical vapor deposition (PECVD). When the aspect ratio of the opening is between 3 and 10, the second conductive layer 18 is deposited by, for example, chemical vapor deposition (CVD). When the aspect ratio of the opening is greater than 10, the second conductive layer 18 is deposited by, for example, atomic layer deposition (ALD).

Figure 6C:
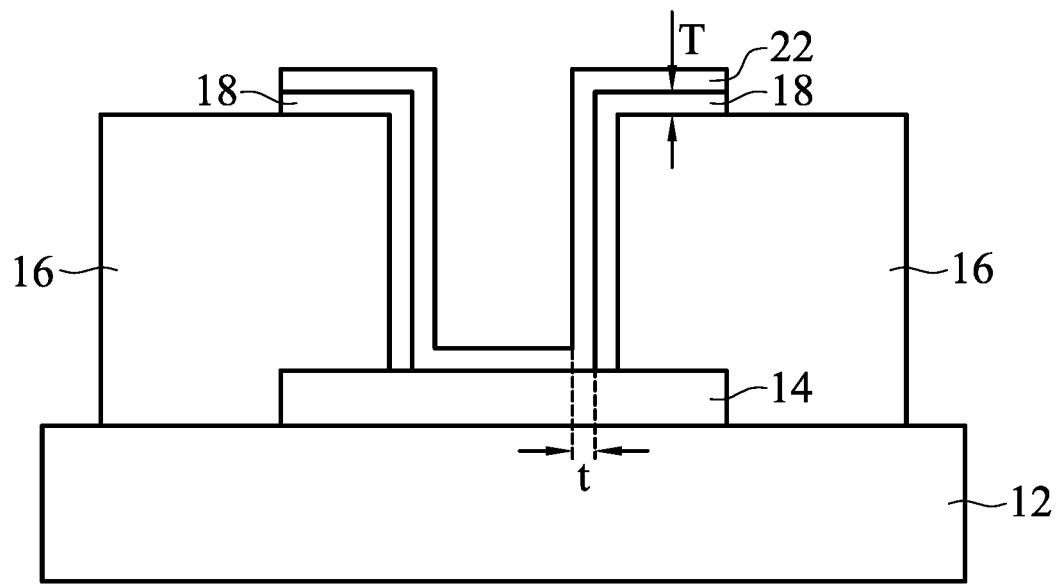

Next, as shown in FIG. 6C, a ferroelectric (FE) layer 22 is formed on the exposed first conductive layer 14 and the second conductive layer 18. In one embodiment, the ferroelectric layer 22 is deposited by, for example, atomic layer deposition (ALD). In one embodiment, the thickness "t" of the ferroelectric layer 22 is in a range from about 20 Å to about 200 Å.

Figure 6D:
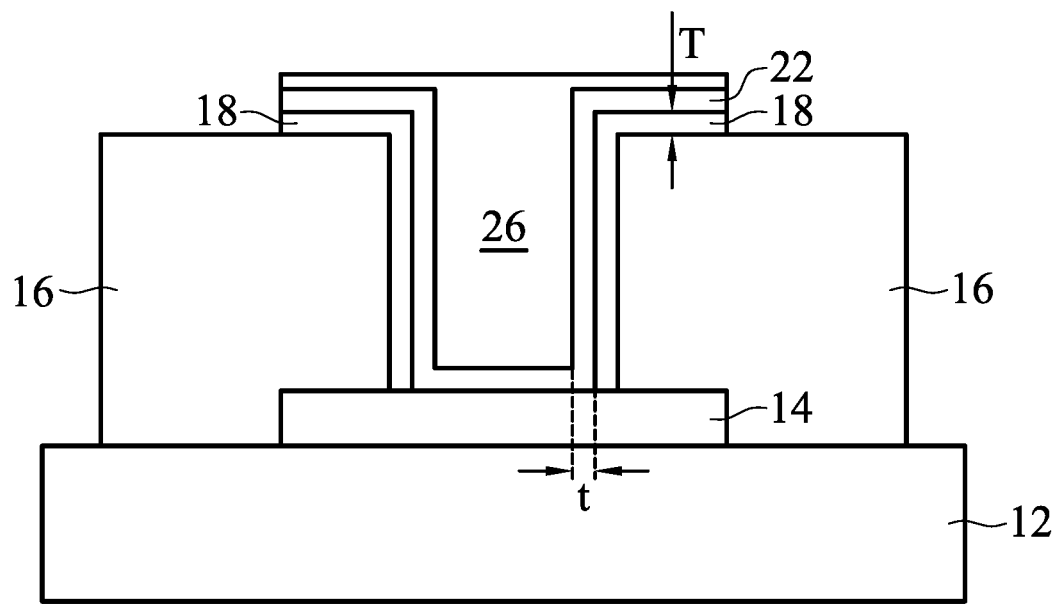

Next, as shown in FIG. 6D, a third conductive layer 26 is filled between the ferroelectric layer 22. In one embodiment, the third conductive layer 26 is deposited by, for example, plasma-enhanced chemical vapor deposition (PECVD), chemical vapor deposition (CVD) or atomic layer deposition (ALD).

Figure 6E:
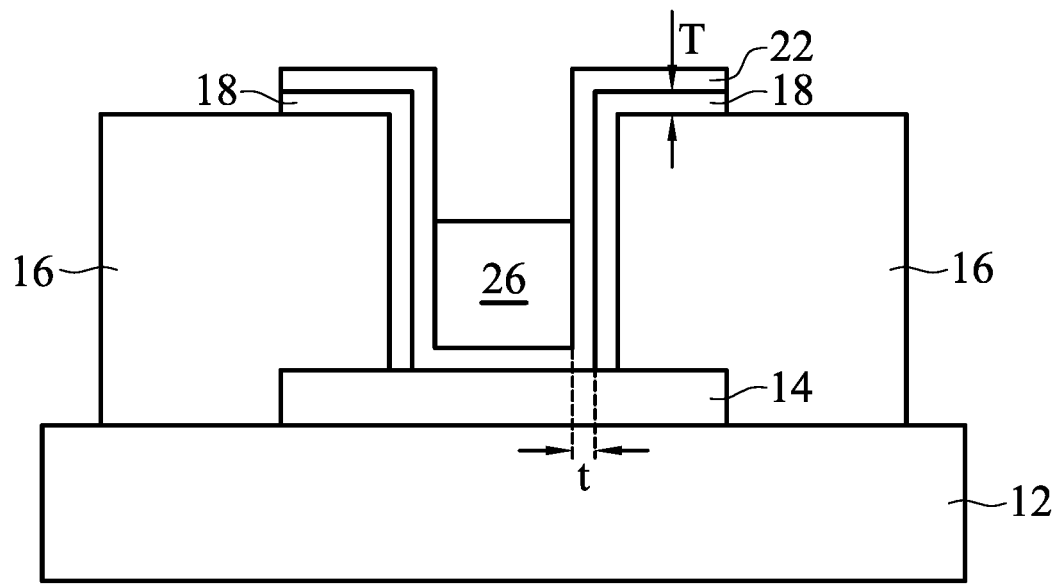

Next, as shown in FIG. 6E, a part of the third conductive layer 26 is etched to a specific height, that is, the height of the subsequently formed ferroelectric layer. In one embodiment, the third conductive layer 26 is etched using any appropriate etching processes.

Figure 6F:
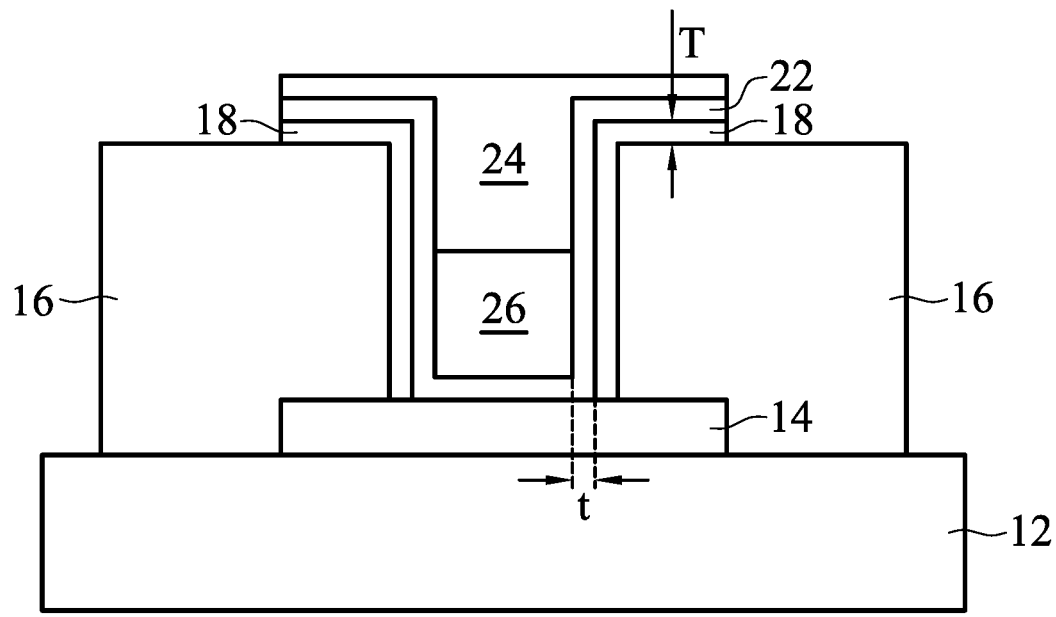

Next, as shown in FIG. 6F, a conductive oxide layer 24 is filled on the third conductive layer 26. In one embodiment, the conductive oxide layer 24 is deposited by, for example, chemical vapor deposition (CVD) or atomic layer deposition (ALD).

Figure 6G:
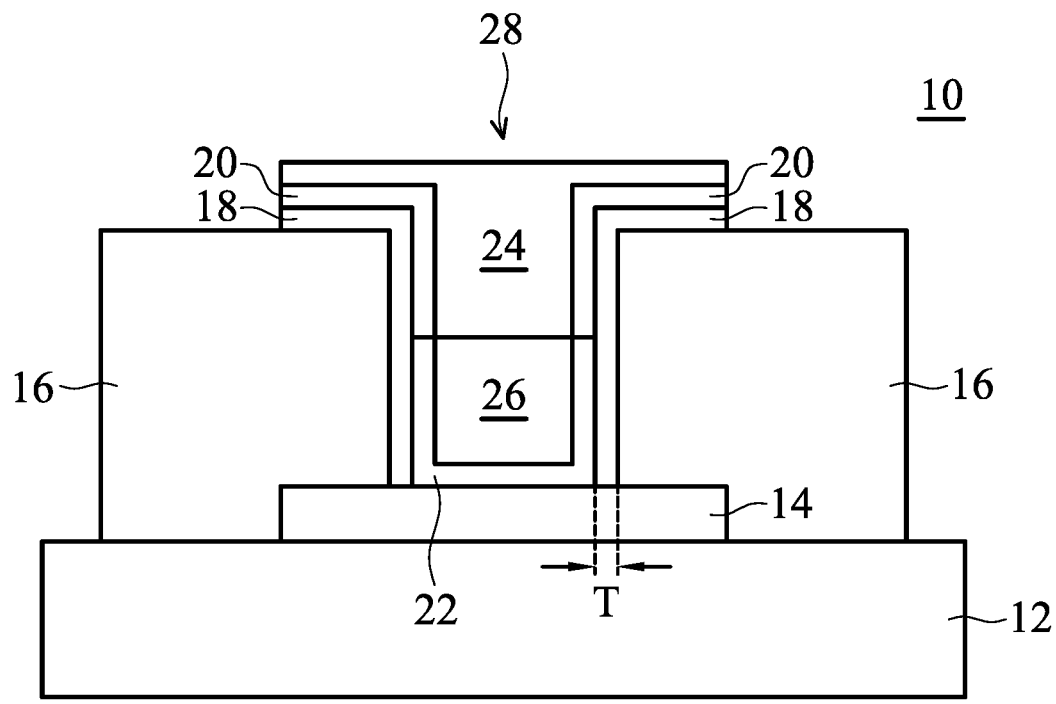

Next, an annealing process 28 is performed. Due to various environmental stresses around the ferroelectric layer 22, the ferroelectric layer 22 located around the conductive oxide layer 24 (which generates a less stress) is transformed into the antiferroelectric layer 20 after the annealing process 28. The ferroelectric layer 22 located around the third conductive layer 26 (which generates a greater stress) is still maintained as a ferroelectric layer, so that a three-dimensional parallel architecture of the ferroelectric layer 22 and the antiferroelectric layer 20 is formed, as shown in FIG. 6G.

In one embodiment, the temperature of the annealing process 28 is in a range from about 350° C. to about 600° C. So far, the production of the ferroelectric memory of this embodiment is completed.

The disclosure creates an environmental stress design in structures to form various stress environments around the originally deposited ferroelectric layer before the annealing process. After the annealing process, the ferroelectric layer in a relatively-low stress environment is transformed to form an anti-ferroelectric (AFE) layer with a ferroelectric-delayed wake-up behavior; while the ferroelectric layer in a relatively-high stress environment maintains the characteristics of the original ferroelectric (FE) layer. A three-dimensional parallel architecture of the ferroelectric (FE) layer combined with the antiferroelectric (AFE) layer is thus formed. Although the ferroelectric capacitor generates a fatigue effect during the operation of the component, the property of the antiferroelectric capacitor is converted from the originally antiferroelectric property to the ferroelectric property simultaneously, and thus the ferroelectric-delayed wake-up property is provided. This phenomenon can just compensate for the fatigue effect generated by the ferroelectric capacitor, thereby effectively improving the number of operations of the component by $10^{10}$ or more, and slowing down the operation deterioration.

While the disclosure has been described by way of example and in terms of embodiment, it is to be understood that the disclosure is not limited thereto. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A ferroelectric memory, comprising:
   a substrate;
   a first conductive layer disposed on the substrate;
   a patterned oxide layer disposed on the first conductive layer and the substrate, exposing a part of the first conductive layer;
   a second conductive layer disposed on the exposed first conductive layer and the patterned oxide layer;
   an antiferroelectric layer disposed on the exposed first conductive layer and the second conductive layer;
   a ferroelectric layer disposed on the second conductive layer and located on the antiferroelectric layer;
   a conductive oxide layer disposed between two portions of the antiferroelectric layer; and
   a third conductive layer disposed on the conductive oxide layer and between two portions of the ferroelectric layer.

2. The ferroelectric memory as claimed in claim 1, wherein the patterned oxide layer comprises silicon oxide, silicon nitride or silicon oxynitride.

3. The ferroelectric memory as claimed in claim 1, wherein the first conductive layer, the second conductive layer and the third conductive layer comprise semiconductor, conductive dielectric or metal.

4. The ferroelectric memory as claimed in claim 3, wherein the first conductive layer, the second conductive layer and the third conductive layer comprise zirconium (Zr), hafnium (Hf), titanium nitride (TiN), titanium (Ti), tantalum (Ta), tantalum nitride (TaN), tantalum silicide (TaSi), tantalum carbonitride (TaCN), titanium aluminum nitride (TiAlN), zinc (Zn), nickel (Ni), nickel silicide (NiSi), ruthenium (Ru), carbon (C), silicon (Si), silicon nitride (SiNx), germanium (Ge), platinum (Pt), aluminum (Al), aluminum nitride (AlN), yttrium (Y), gadolinium (Gd), strontium (Sr), tungsten (W), tungsten silicide (WSi), tungsten nitride (WN), gallium (Ga) or gallium nitride (GaN).

5. The ferroelectric memory as claimed in claim 1, wherein the antiferroelectric layer and the ferroelectric layer comprise hafnium zirconium oxide (HfZrOx), hafnium silicon oxide (HfSiOx), hafnium oxide (HfOx), hafnium yttrium oxide (HfYOx), hafnium gadolinium oxide (HfGdOx), hafnium strontium oxide (HfSrOx), strontium titanium oxide (SrTiOx), strontium calcium titanate (SrCaTiO3), Ag(Nb1-xTax)O3, barium strontium titanate (BaSrTiO3), barium titanate (BaTiO3), zirconium oxide (ZrOx) or hafnium aluminum oxide (HfAlOx).

6. The ferroelectric memory as claimed in claim 1, wherein the conductive oxide layer comprises zinc oxide (ZnO), titanium oxide (TiOx), titanium oxynitride (TiON), tantalum oxynitride (TaON), silicon oxide (SiOx), silicon oxynitride (SiONx), ruthenium oxide (RuO), strontium ruthenium oxide (SrRuO), strontium hafnium oxide (SrHfO3), germanium oxide (GeO), tantalum oxide (TaO) or tantalum pentoxide (Ta2O5).

7. The ferroelectric memory as claimed in claim 1, wherein the patterned oxide layer comprises a first portion and a second portion located on the first portion, wherein the second portion has more stress than that of the first portion, the first portion corresponds to the antiferroelectric layer, and the second portion corresponds to the ferroelectric layer.

8. A ferroelectric memory, comprising:
   a substrate;
   a first conductive layer disposed on the substrate;
   a patterned oxide layer disposed on the first conductive layer and the substrate, exposing a part of the first conductive layer;
   a second conductive layer disposed on the exposed first conductive layer and the patterned oxide layer;
   a ferroelectric layer disposed on the exposed first conductive layer and the second conductive layer;
   an antiferroelectric layer disposed on the second conductive layer and located on the ferroelectric layer;
   a third conductive layer disposed between two portions of the ferroelectric layer; and
   a conductive oxide layer disposed on the third conductive layer and between two portions of the antiferroelectric layer.

9. The ferroelectric memory as claimed in claim 8, wherein the patterned oxide layer comprises silicon oxide, silicon nitride or silicon oxynitride.

10. The ferroelectric memory as claimed in claim 8, wherein the first conductive layer, the second conductive layer and the third conductive layer comprise semiconductor, conductive dielectric or metal.

11. The ferroelectric memory as claimed in claim 10, wherein the first conductive layer, the second conductive layer and the third conductive layer comprise zirconium (Zr), hafnium (Hf), titanium nitride (TiN), titanium (Ti), tantalum (Ta), tantalum nitride (TaN), tantalum silicide (TaSi), tantalum carbonitride (TaCN), titanium aluminum nitride (TiAlN), zinc (Zn), nickel (Ni), nickel silicide (NiSi), ruthenium (Ru), carbon (C), silicon (Si), silicon nitride (SiNx), germanium (Ge), platinum (Pt), aluminum (Al), aluminum nitride (AlN), yttrium (Y), gadolinium (Gd), strontium (Sr), tungsten (W), tungsten silicide (WSi), tungsten nitride (WN), gallium (Ga) or gallium nitride (GaN).

12. The ferroelectric memory as claimed in claim 8, wherein the ferroelectric layer and the antiferroelectric layer comprise hafnium zirconium oxide (HfZrOx), hafnium silicon oxide (HfSiOx), hafnium oxide (HfOx), hafnium yttrium oxide (HfYOx), hafnium gadolinium oxide (HfGdOx), hafnium strontium oxide (HfSrOx), strontium titanium oxide (SrTiOx), strontium calcium titanate (SrCaTiO3), Ag(Nb1-xTax)O3, barium strontium titanate (BaSrTiO3), barium titanate (BaTiO3), zirconium oxide (ZrOx) or hafnium aluminum oxide (HfAlOx).

13. The ferroelectric memory as claimed in claim 8, wherein the conductive oxide layer comprises zinc oxide (ZnO), titanium oxide (TiOx), titanium oxynitride (TiON), tantalum oxynitride (TaON), silicon oxide (SiOx), silicon oxynitride (SiONx), ruthenium oxide (RuO), strontium ruthenium oxide (SrRuO), strontium hafnium oxide (SrHfO3), germanium oxide (GeO), tantalum oxide (TaO) or tantalum pentoxide (Ta2O5).

14. The ferroelectric memory as claimed in claim 8, wherein the patterned oxide layer comprises a first portion and a second portion located on the first portion, wherein the first portion has more stress than that of the second portion, the first portion corresponds to the ferroelectric layer, and the second portion corresponds to the antiferroelectric layer.

15. A method for fabricating the ferroelectric memory of claim 1, comprising:
providing the substrate;
forming the first conductive layer on the substrate;
forming the patterned oxide layer on the first conductive layer and the substrate, exposing a part of the first conductive layer;
forming the second conductive layer on the exposed first conductive layer and the patterned oxide layer;
forming the ferroelectric layer on the exposed first conductive layer and the second conductive layer;
forming a precursor conductive oxide layer between two portions of the ferroelectric layer;
etching a part of the precursor conductive oxide layer to form the conductive oxide layer;
forming the third conductive layer on the conductive oxide layer; and
performing an annealing process, so that the ferroelectric layer surrounding the conductive oxide layer forms the antiferroelectric layer.

16. The method for fabricating a ferroelectric memory as claimed in claim 15, wherein the step of forming the patterned oxide layer comprises forming a first sub-oxide layer, and then, forming a second sub-oxide layer on the first sub-oxide layer, and then patterning the first sub-oxide layer and the second sub-oxide layer, wherein the second sub-oxide layer has more stress than that of the first sub-oxide layer.

17. The method for fabricating a ferroelectric memory as claimed in claim 15, wherein the annealing process has a temperature which is in a range from 350° C. to 600° C.

18. A method for fabricating the ferroelectric memory of claim 8, comprising:
providing the substrate;
forming the first conductive layer on the substrate;
forming the patterned oxide layer on the first conductive layer and the substrate, exposing a part of the first conductive layer;
forming the second conductive layer on the exposed first conductive layer and the patterned oxide layer;
forming the ferroelectric layer on the exposed first conductive layer and the second conductive layer;
forming a precursor third conductive layer between two portions of the ferroelectric layer;
etching the part of the precursor third conductive layer to form the third conductive layer;
forming the conductive oxide layer on the third conductive layer; and
performing an annealing process, so that the ferroelectric layer surrounding the conductive oxide layer forms the antiferroelectric layer.

19. The method for fabricating a ferroelectric memory as claimed in claim 18, wherein the step of forming the patterned oxide layer comprises forming a first sub-oxide layer, and then, forming a second sub-oxide layer on the first sub-oxide layer, and then patterning the first sub-oxide layer and the second sub-oxide layer, wherein the first sub-oxide layer has more stress than that of the second sub-oxide layer.

20. The method for fabricating a ferroelectric memory as claimed in claim 18, wherein the annealing process has a temperature which is in a range from 350° C. to 600° C.

* * * * *